(12) United States Patent
Chen et al.

(10) Patent No.: US 8,405,108 B2
(45) Date of Patent: Mar. 26, 2013

(54) RED AND GREEN FLUOROSULFIDE PHOSPHOR, PREPARATION METHOD AND WHITE-LIGHT EMITTING DIODES

(75) Inventors: Teng-Ming Chen, Hsinchu (TW); Yun-Chen Wu, Taipei (TW)

(73) Assignee: National Chiao Tung University, Hsinchu (TW)

( * ) Notice: Subject to any disclaimer, the term of this patent is extended or adjusted under 35 U.S.C. 154(b) by 85 days.

(21) Appl. No.: 13/090,516

(22) Filed: Apr. 20, 2011

(65) Prior Publication Data

US 2011/0198651 A1 Aug. 18, 2011

(30) Foreign Application Priority Data

Jan. 24, 2011 (TW) .............................. 100102536 A

(51) Int. Cl.
*H01L 33/00* (2010.01)
(52) U.S. Cl. ......................................................... 257/98
(58) Field of Classification Search ............ 257/88–103, 257/E33.061
See application file for complete search history.

(56) References Cited

U.S. PATENT DOCUMENTS 8,242,525 B2 * 8/2012 Tian et al. .................. 257/98
2008/0128679 A1 * 6/2008 Tian et al. .................. 257/98

FOREIGN PATENT DOCUMENTS

JP 2004339475 12/2004
WO 0073210 12/2000

OTHER PUBLICATIONS

Par N. Rysanek Et O.Loye, "Structure Cristalline de YSF", Acta Cryst. (1973). B29, 1567-1569.
Thomas Schleid, "Drei Formen Von Selten-Erd(III)-Fluoridsulfiden; A-LaFS, B-YFS und C-LuFS", Z. Anorg. Allg. Chem. 1999, 625, 1700-1706.
Thomas Schleid, "YB3F4S2: Ein Gemischtvalentes Ytterbiumfluoridsulfid gemab Ybf2-2 YbFS", Z. Anorg. Allg. Chem. 2000, 626, 2429-2431.
Demourgues, et al., "Rare Earth Fluorosulfides LnSF and Ln2AF4S2 as New Colour Pigments", J. Alloys comp. 2001, 323-324, 223-230.
Demourgues, et al., "Preparation and Structural Properties of New Series of Mixed-Anion Compounds: Rare Earth Fluorosulfides", J. Fluorine Chem. 2001, 107, 215-221.
Pauwels, et al., "Structural Features of New Rare Earth-Based Mixed Anions (O, S, F) Compounds: Relationships Between Optical Absorption and Rare Earth Environment", Solid State Sci. 2002, 4, 1471-1479.
Grossholz, et al., "Eu3F4S2: Synthesis, Crystal Structure, and Magnetic Properties of the Mixed-Valent Europium (II,III) Fluoride Sulfide EuF2 (EuFS)2", J Solid State Chem. 2009, 182,3071-3075.
Schmid, et al., "Vever Chalkogenidfluoride Einiger Seltener Erden", Z. Anorg. Allg. Chem. 1969, 373, 168-175.
English language translation of abstract of JP 2004339475 (published Dec. 2, 2004).

* cited by examiner

*Primary Examiner* — Cuong Q Nguyen
(74) *Attorney, Agent, or Firm* — McClure, Qualey & Rodack, LLP

(57) ABSTRACT

Novel red and green fluorosulfide phosphors have a chemical formula of $(A_{1-x-y}Ce_xB_y)SF$, wherein A and B are both trivalent metal ions, $0<x\leq0.1$, and $0\leq y\leq1$. A is a rare earth metal, B is a rare earth metal or a group 13 metal. A preparation method of the fluorosulfide and white-light emitting diode application thereof are also disclosed.

10 Claims, 11 Drawing Sheets

RED AND GREEN FLUOROSULFIDE PHOSPHOR, PREPARATION METHOD AND WHITE-LIGHT EMITTING DIODES

RELATED APPLICATIONS

This application claims priority to Taiwan Application Serial Number 100102536, filed Jan. 24, 2011, which is herein incorporated by reference.

BACKGROUND

1. Field of Invention

The present invention relates to a phosphor. More particularly, the present invention relates to a fluorosulfide phosphor.

2. Description of Related Art

Light emitting diode (LED) is a kind of semiconductor light source. Comparing to transitional light sources, the characteristic of LEDs are small, luminescent efficiency, life-durable, energy saving and environmental friendly. Since LED has been used for illumination applications in recent years, much attention has been directed to develop white light emitting diode (WLED).

The most popular way to produce high intensity white LEDs are by phosphor method, i.e. phosphor-based LEDs. This method involves coating one color of an LED with different color of phosphors to form white light. There are two primary ways for producing white light based on the phosphor-based LEDs method. One is to encapsulate a near UV, purple or blue LED with a yellow phosphor to form white light; however this white light lacks of red and green of three primary colors, the white light displays in poor color rendering and cold colors temperature. The other is to encapsulate a near UV, purple or blue LED with red and green color phosphors, this kind of white light displays the warm color temperature and shows greater application ranges.

In recently years, $Eu^{3+}$-doped oxide, $Mn^{4+}$-doped fluoride, $Eu^{2+}$-doped nitride, $Eu^{3+}$-doped oxide, and $Mn^{4+}$-doped fluoride are the most applied red phosphors coating in UV, near UV or blue light LEDs. Although $Eu^{3+}$-doped oxide and $Mn^{4+}$-doped fluoride phosphors display linear orange-red light, the color saturation of red light emitted from that two phosphors are still insufficient. Broad band emission of $Eu^{2+}$-doped nitride are investigated, but the preparing condition of $Eu^{2+}$-doped nitride are not feasible, since they must be calcined under high pressure and high temperature condition, resulting in increasing in producing cost.

Besides, yellow-green color emitting $Eu^{2+}$-doped oxide and $Tb^{3+}$-doped oxide compounds are the common green phosphors applied in UV, near UV or blue light LEDs. $Tb^{3+}$-doped oxide compounds shows the less conversion efficiency for its linear yellow-green light in the blue light range. Although $Eu^{2+}$-doped oxide compound display the broad band emitting range, the highly hygroscopic quality of this compound making it difficult to save and higher cost.

SUMMARY

Hence, in one aspect, the present invention directs to a series of fluorosulfide phosphors for coating on a blue or UV LED to form a white-light emitting diode. The fluorosulfide phosphors have a chemical formula of $(A_{1-x-y}Ce_xB_y)SF$, wherein A and B are trivalent metal ions other than Ce, $0 < x \leq 0.1$, and $0 \leq y \leq 1$.

According to one embodiment of the present invention, A can be a rare earth metal, where the rare earth metal is La, Pr, Nd, Sm, Eu, Gd, Tb, Dy, Ho, Er, Tm, Yb or Lu. B can be a rare earth metal or a group 13 metal, where the rare earth metal is La, Pr, Nd, Pm, Sm, Eu, Gd, Tb, Dy, Ho, Er, Tm, Yb, Lu, Sc or Y, and the group 13 metal is Al, Ga or In.

According to one embodiment of the present invention, the phosphor mentioned above is a red phosphor when the crystal structure of the phosphor is tetragonal crystal system.

According to another embodiment of the invention, the phosphor mentioned above is a green phosphor when the crystal structure of the phosphor is hexagonal crystal system.

In another aspect, this invention also directs to a white light emitting diode comprising a blue phosphor, a green phosphor and the red phosphor of the fluororsulfide mentioned above.

In another aspect, this invention also directs to a white light emitting diode comprising a blue phosphor, a red phosphor and the green phosphor of the fluororsulfide described above.

In another aspect, this invention also directs to a method of preparing the fluororsulfide phosphor described above, which comprises the following steps. Stoichiometric amounts of the required raw materials are weighted, where the raw materials are at least a metal sulfide and at least a metal fluoride, the metal of which is a rare earth metal, a group 13 metal of periodic or a combination thereof. The weighted stoichiometric amounts of the raw materials are uniformly mixed. The mixed raw materials are then calcined under a vacuum environment $10^{-2}$ torr at a temperature of 900 to 1200° C. until a pure crystal phase of phosphor is obtained. Finally, the phosphor is cooled to room temperature to obtain the phosphor as described foregoing.

According to another embodiment of the invention, a red phosphor with tetragonal crystal phase is obtained when the mixed materials are calcined at a temperature of 900 to 950° C.

According to another embodiment of the invention, a green phosphor with hexagonal crystal phase is obtained when the mixed materials were calcined at a temperature of 1150 to 1200° C.

The red phosphors and green phosphors presented herein exhibit better luminescent properties with respect to light conversion efficiency, broad-band emitting characteristic and red color saturation in UV or blue color excitation region. Furthermore, both phosphors described above are easily to prepare, i.e. no necessity of high pressure or high temperature condition when calcination), and thus effectively reduce the production costs. Hence, the phosphors presented herein solve the color saturation and preparation cost issues comparing to the conventional red and green phosphors.

The above presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

Many of the attendant features will be more readily appreciated as the same becomes better understood by reference to the following detailed description considered in connection with the accompanying drawings.

BRIEF DESCRIPTION OF THE DRAWINGS

The invention can be more fully understood by reading the following detailed description of the embodiment, with reference made to the accompanying drawings as follows.

DETAILED DESCRIPTION

Cerium is a member of lanthanide group, and Ce$^{3+}$-doped phosphor compounds usually present emission range from UV to red color depending upon the host lattice structure, site size and crystal field strength of the compound. Therefore, the tunable luminescent properties of Ce$^{3+}$-doped compounds allowing them to applied in LED.

Fluorosulfide is a host material and usually used as a pigment, because rare earth metal-doped fluorosulfides and alkali earth metal-doped fluorosulfides display yellow to red color. Moreover, the fluorosulfides display various colors depending on various crystal structures.

Fluorosulfide Phosphor

Accordingly, a fluorosulfide phosphor having a chemical formula $(A_{1-x-y}Ce_xB_y)SF$ is provided herein, where Ce is a trivalent cation, A and B are also trivalent cations other than Ce, $0<x\leq0.1$, and $0\leq y\leq1$. In $(A_{1-x-y}Ce_xB_y)SF$, A is a lanthanide element, and B can be a rare earth element or a group 13 element in periodic table. The rare earth element can be Sc, Y or a lanthanide element other than Ce. The lanthanide element can be La, Pr, Nd, Pm, Sm, Eu, Gd, Tb, Dy, Ho, Er, Tm, Yb, or Lu. The group 13 metal can be Al, Ga or In.

Two crystal forms, tetragonal and hexagonal crystal system, of the above mentioned fluorosulfide phosphors were discovered in this research. Thus, chemical formula is symbolized as α-$(A_{1-x-y}Ce_xB_y)SF$ when the fluorosulfide is a red phosphor in tetragonal crystal structure, whereas chemical formula is symbolized as β-$(A_{1-x-y}Ce_xB_y)SF$ when the fluorosulfide is a green phosphor in hexagonal crystal structure. Besides, chemical formula is symbolized as $(A_{1-x}Ce_x)SF$ when y is zero.

The Method of Preparing Fluorosulfide Phosphors

Figure 1:
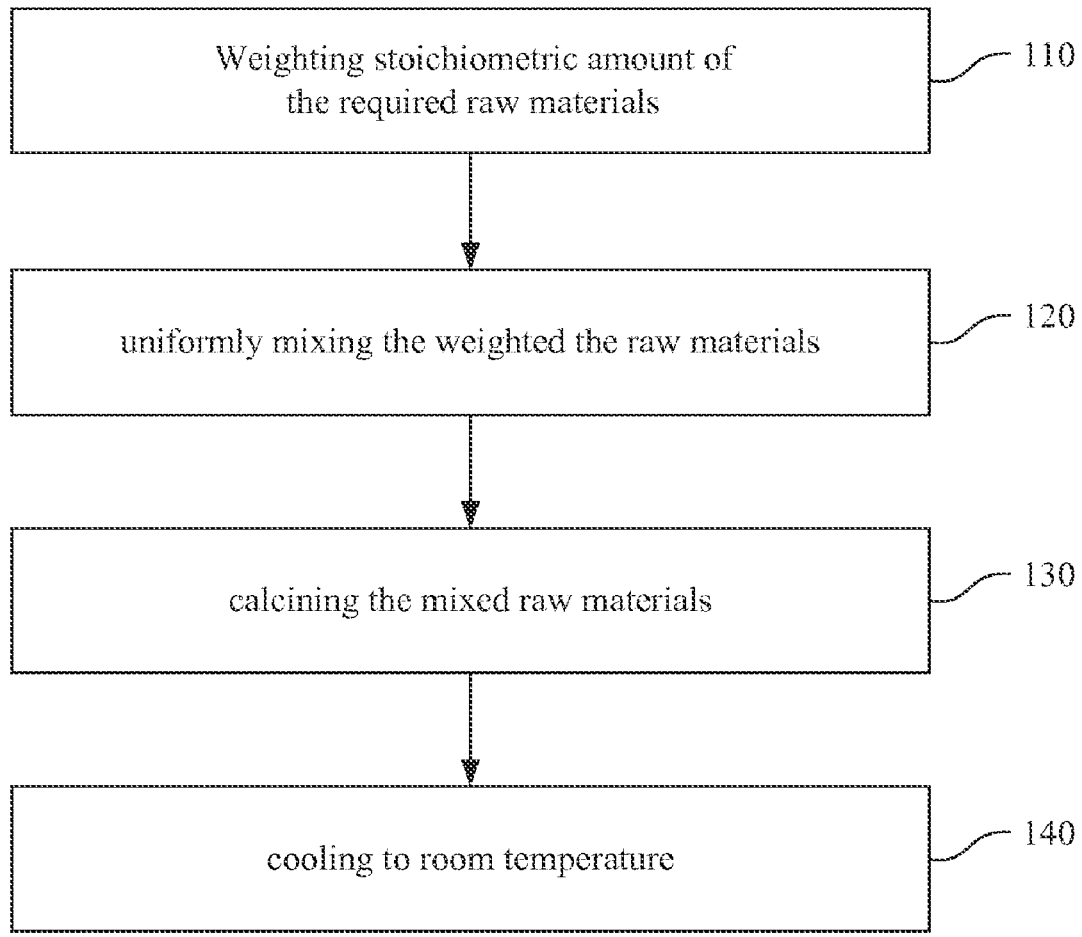
FIG. 1 is the flowchart of preparing fluorosulfide phosphor

In step 110 in FIG. 1, stoichiometric amounts of required raw materials are weighted respectively based on the chemical formula mentioned above. Metal sulfide or metal fluoride is chosen for the sources of Ce, A and B and for sulfur and fluorine as well. For example, $YF_3$ or $Y_2S_3$ can be selected for yttrium ion source, $LaF_3$ or $La_2S_3$ can be selected for lanthanum ion source, whereas and the rest of other metal ion can be done in the same manner.

Afterwards, in step 120, the required raw materials are mixed uniformly. For example, grinding can be selected as one of the mixing process. In step 120, the mixed raw materials are then calcined under low pressure vacuum environment of $10^{-2}$ torr at temperature of 900-1200° C. until a pure crystal form is obtained. Finally in step 130, the phosphor is subsequently cooled to room temperature.

According to one embodiment of the present invention, a red phosphor having a tetragonal crystal structure is obtained when the calcined temperature is 900 to 950° C., and the chemical formula is symbolized as α-$(A_{1-x-y}Ce_xB_y)SF$.

According to another embodiment of the present invention, a green phosphor having a hexagonal crystal structure is obtained when the calcined temperature is 1150 to 1200° C., and the chemical formula is symbolized as β-$(A_{1-x-y}Ce_xB_y)SF$.

Embodiment 1: α-YSF Doped with Different Concentrations of Ce$^{3+}$

First of all, different concentrations of Ce$^{3+}$ were doped in α-YSF in order to examine the effectiveness of Ce$^{3+}$ concentration on excitation and emission properties of the phosphors. In this embodiment, $A^{3+}$ is $Y^{3+}$, y is 0, x is 0, 0.001, 0.005, 010, 0.020, 0.030, 0.050, 0.075, 0.100 and 1 respectively in the formula α-$(A_{1-x-y}Ce_xB_y)SF$. The preparing method is described in FIG. 1, where calcination temperature is 900 to 950° C. in this embodiment in order to obtain the red color phosphors.

Figure 2:
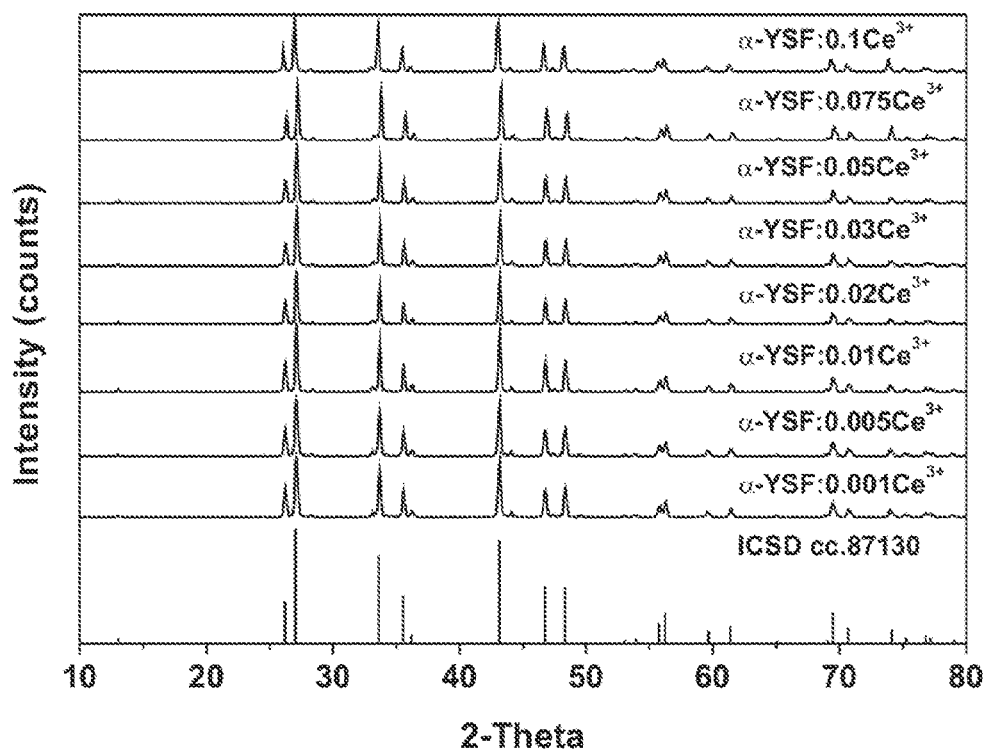
FIG. 2 is the XRD spectra of $\alpha$-YSF:xCe$^{3+}$.
Figure 3:
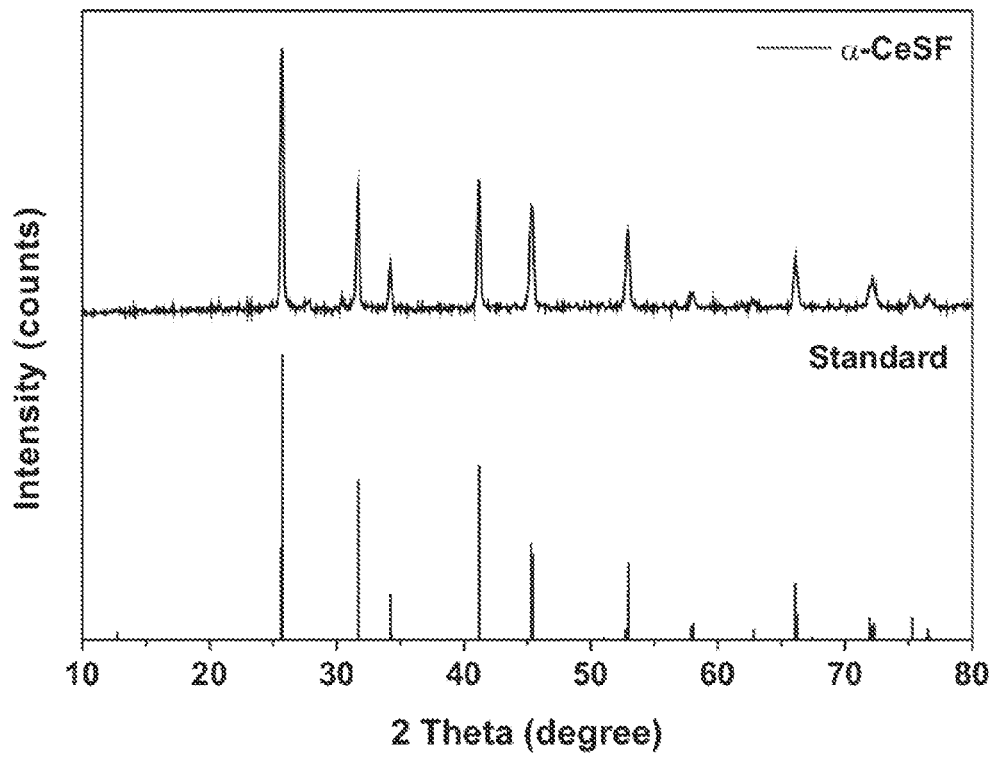
FIG. 3 is the XRD spectra of $\alpha$-CeSF.
Figure 4:
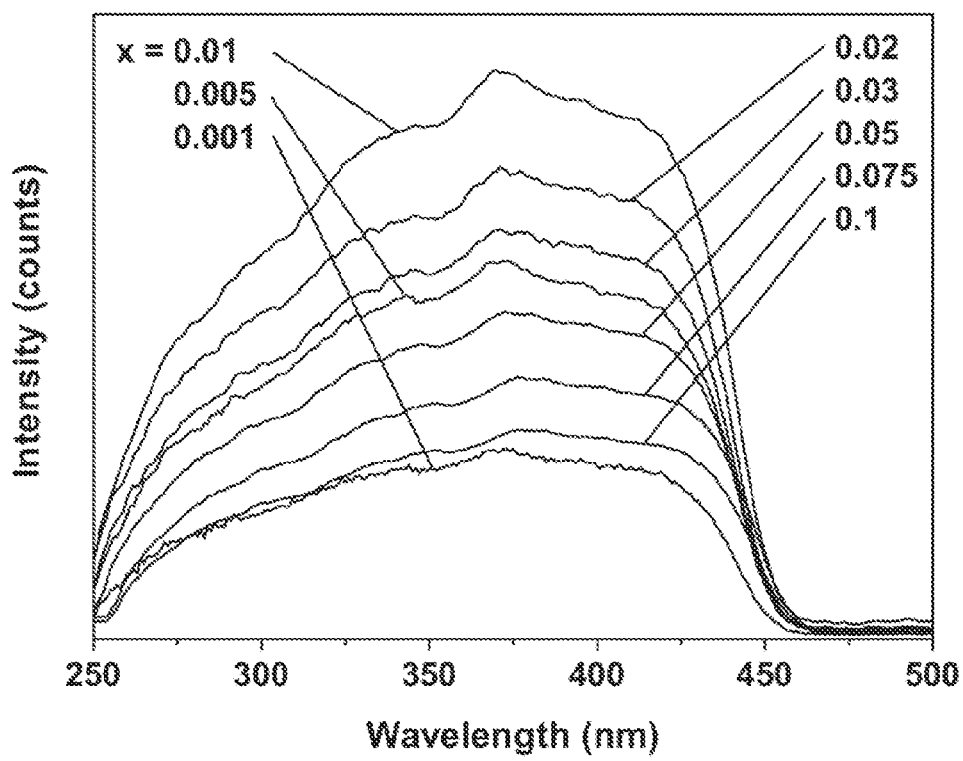
FIGS. 4-5 are the excitation spectra and emission spectra of α-$(Y_{0.99})$S:xCe$^{3+}$ respectively.
Figure 5:
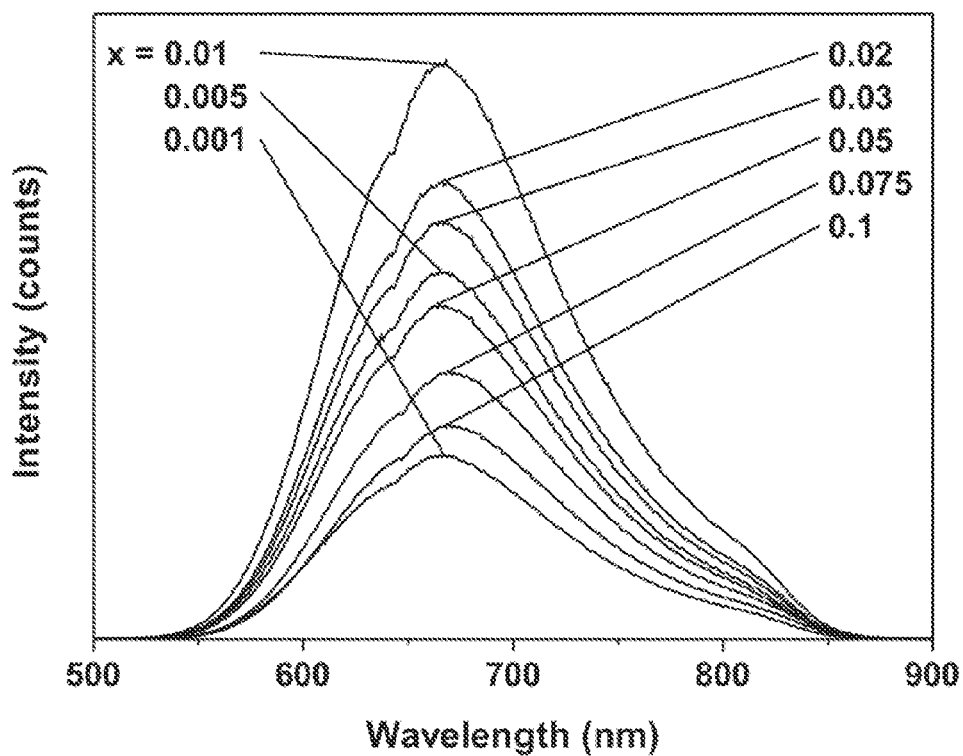
Figure 6:
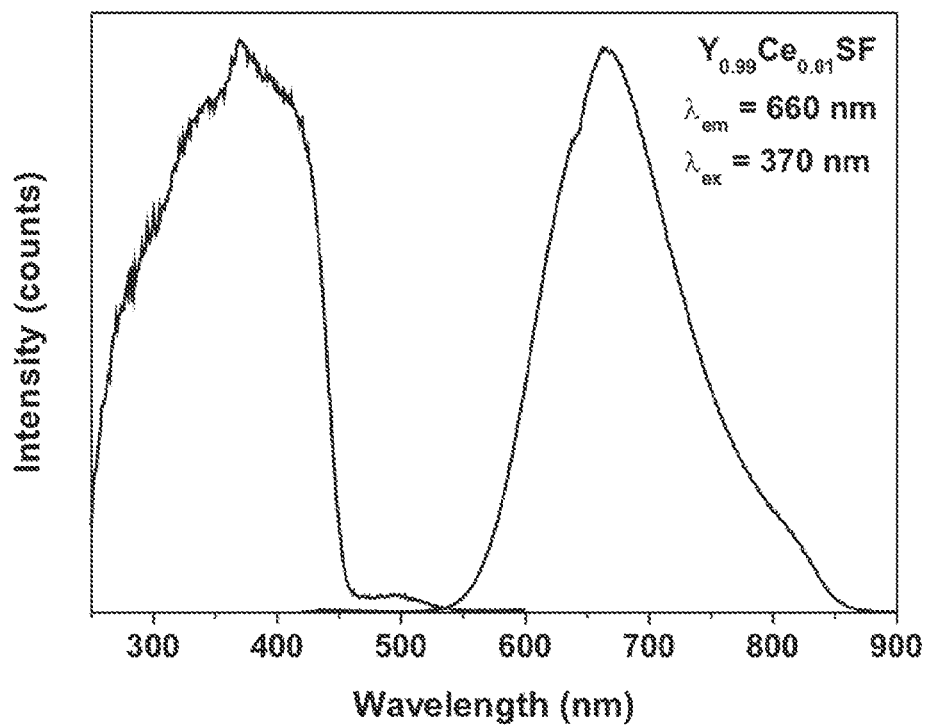
FIG. 6 is the excitation and emission spectra of $Y_{0.99}Ce_{0.01}SF$.

The XRD spectra, the excitation spectrum and the emission spectrum of Examples 1-8 are shown in FIGS. 2, 4 and 5 respectively, where the formula α-YSF:xCe$^{3+}$ shown in FIG. 2 equals to chemical formula α-$(A_{1-x}Ce_x)SF$. The XRD spectrum of Example 9 is shown in FIG. 3. The excitation and emission spectrum of Example 3 are shown in FIG. 6. The photoluminescence properties of Examples 1-9 are summarized in Table 1.

TABLE 1

Photoluminescence properties of different Ce$^{3+}$ concentration doped in α-YSF

| | Example | Main Ex Range (nm) | Excitation (nm) | Main Em Range (nm) | Emission (nm) | CIE (x, y) |
|---|---|---|---|---|---|---|
| 1 | α-$(Y_{0.999}Ce_{0.001})SF$ | 250-560 | 373 | 504-897 | 667 | 0.65, 0.34 |
| 2 | α-$(Y_{0.995}Ce_{0.005})SF$ | 250-560 | 373 | 505-899 | 665 | 0.65, 0.34 |
| 3 | α-$(Y_{0.99}Ce_{0.01})SF$ | 250-560 | 369 | 506-900 | 667 | 0.65, 0.34 |
| 4 | α-$(Y_{0.98}Ce_{0.02})SF$ | 250-559 | 371 | 505-900 | 667 | 0.65, 0.34 |
| 5 | α-$(Y_{0.97}Ce_{0.03})SF$ | 250-560 | 371 | 505-900 | 667 | 0.65, 0.34 |
| 6 | α-$(Y_{0.95}Ce_{0.05})SF$ | 250-560 | 373 | 504-900 | 667 | 0.65, 0.34 |
| 7 | α-$(Y_{0.925}Ce_{0.075})SF$ | 250-560 | 377 | 503-899 | 668 | 0.66, 0.34 |

TABLE 1-continued

Photoluminescence properties of different $Ce^{3+}$ concentration doped in $\alpha$-YSF

| Example | | Main Ex Range (nm) | Excitation (nm) | Main Em Range (nm) | Emission (nm) | CIE (x, y) |
|---|---|---|---|---|---|---|
| 8 | $\alpha$-$(Y_{0.9}Ce_{0.1})$SF | 250-560 | 379 | 501-898 | 668 | 0.66, 0.34 |
| 9 | $\alpha$-CeSF | 250-644 | 388, 513 | x | x | x |

From FIG. 2, The result indicates that the lattice structure of $\alpha$-YSF remain the same with increasing doped $Ce^{3+}$ concentration to 10 mol %. However, Example 9 presents a different lattice structure from Example 1-8, since $Y^{3+}$ is fully occupied by $Ce^{3+}$ in FIG. 3.

From Table 1, FIG. 4 and FIG. 5, the influence of doped $Ce^{3+}$ concentration in red phosphor on photoluminescence properties are observed minor. Besides, from FIGS. 4-5, the major excitation wavelength from 250 to 560 nm and major excitation wavelength from 501 to 900 nm are observed in these exemplary embodiments of red phosphors. Furthermore, the maximum excitation value (at 369 nm in UV region) and the maximum emission intensity (at 667 nm in red light region) are investigated when doped $Ce^{3+}$ is 1 mol % in $\alpha$-YSF, i.e. x=0.01 (Example 3), according to the excitation and emission spectra shown in FIG. 6. However, no emitted light is observed when y=1 (Example 9, $\alpha$-CeSF) according to Table 1.

Hence, comparing to the conventional red phosphors, the exemplary embodiments of the present invention have a great improvement with respect to the wide excitation and emission ranges and saturated red color and color rendering.

Embodiment 2: $\alpha$-$(A_{0.9}Ce_{0.1})$SF Doped with Different Metal of $A^{3+}$ Different metal of $A^{3+}$ were doped in $\alpha$-$(A_{0.9}Ce_{0.1})$SF in order to investigate the effectiveness of $A^{3+}$ on photoluminescence properties of the red phosphors. In this embodiment, y is 0, x is 0.1, $A^{3+}$ is $Y^{3+}$ or $La^{3+}$ in the formula $\alpha$-$(A_{1-x-y}Ce_xB_y)$SF. The preparing method is described in FIG. 1, where calcination temperature is 900 to 950° C. in this embodiment in order to obtain the red phosphors.

Figure 7:
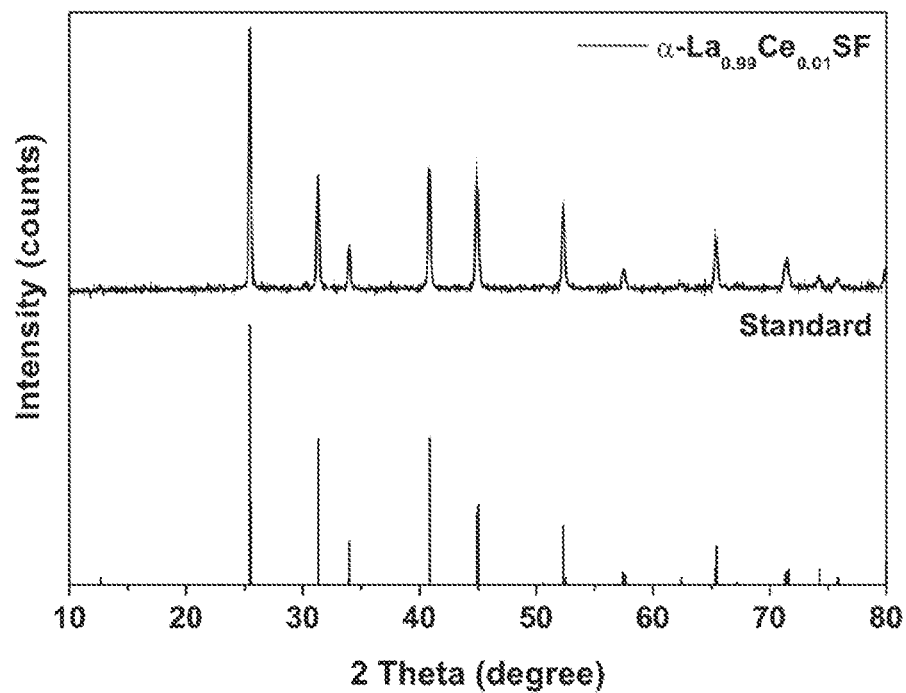
FIG. 7 is the XRD spectra of α-$La_{0.99}Ce_{0.01}SF$ from Example 10.

The XRD spectra of Examples 3 and 10 are presented respectively in FIG. 2 and FIG. 7. The photoluminescence properties of Examples 3 and 10 are summarized in Table 2. It can be observed that diffraction angles of some weak intensity diffraction peaks are relatively shifted, but the relative positions of the main diffraction peaks are still similar. Therefore, the two lattice structures of phosphors in Examples 3 and 10 are tetragonal. However, different atomic radius size of Y and La are doped respectively in Examples 3 and 10, the lattice parameters and atomic bonding distances of the two phosphors are different resulting in the emission range of the two examples are dissimilar observed in Table 2.

TABLE 2 photoluminescence properties of $\alpha$-$(A_{0.9}Ce_{0.1})$SF

| | Example | Main Ex Range (nm) | Excitation (nm) | Main Em Range (nm) | Emission (nm) | CIE (x, y) |
|---|---|---|---|---|---|---|
| 3 | $\alpha$-$(Y_{0.99}Ce_{0.01})$SF | 250-560 | 379 | 501-898 | 668 | 0.66, 0.34 |
| 10 | $\alpha$-$(La_{0.99}Ce_{0.01})$SF | 250-543 | 365 | 519-842 | 644 | 0.63, 0.35 |

Embodiment 3: $\alpha$-$(Y_{0.89}Ce_{0.01}B_{0.1})$SF Dope with Different Metal of $B^{3+}$ Different metal of $B^{3+}$ were doped in $\alpha$-$(Y_{0.89}Ce_{0.01}B_{0.1})$SF in order to investigate the effectiveness of $B^{3+}$ on photoluminescence properties of the red phosphors. In this embodiment, x=0.01, y=0.1, and $A^{3+}$ is $Y^{3+}$, $B^{3+}$ is $Sc^{3+}$, $La^{3+}$, $Sm^{3+}$, $Eu^{3+}$, $Gd^{3+}$, $Tb^{3+}$, $Dy^{3+}$, $Al^{3+}$, $Ga^{3+}$, and $In^{3+}$, respectively. The preparing method is described in FIG. 1, where the calcination temperature is 900 to 950° C. in order to obtain the red color phosphors.

Figure 8:
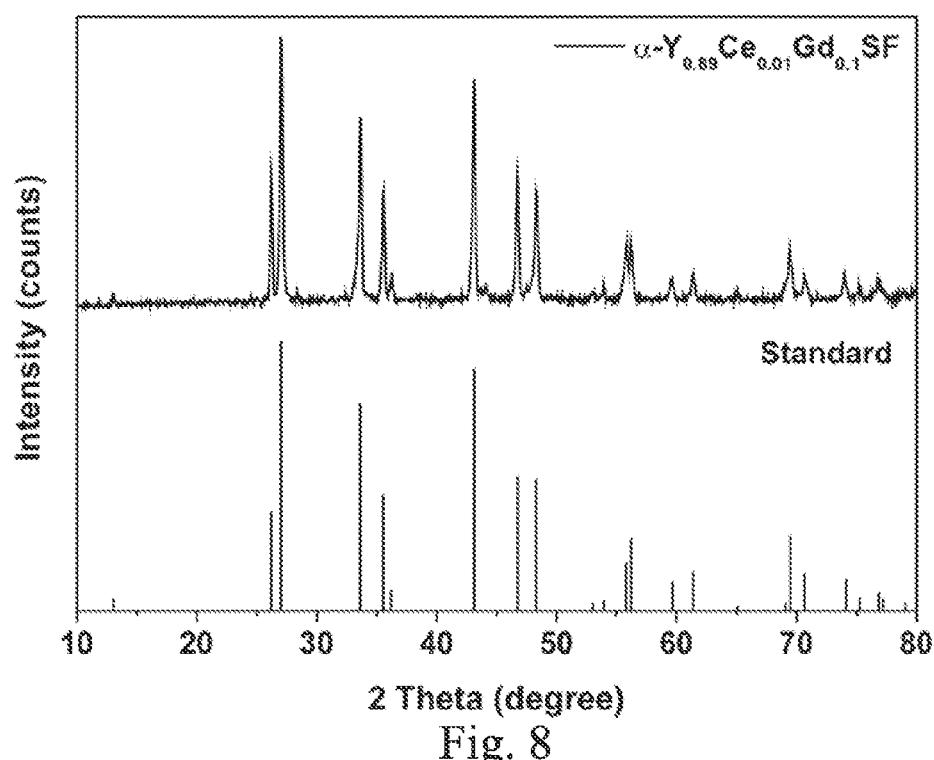
FIG. 8 is XRD spectra of α-$Y_{0.89}Ce_{0.01}Gd_{0.1}SF$ from Example 15.
Figure 9:
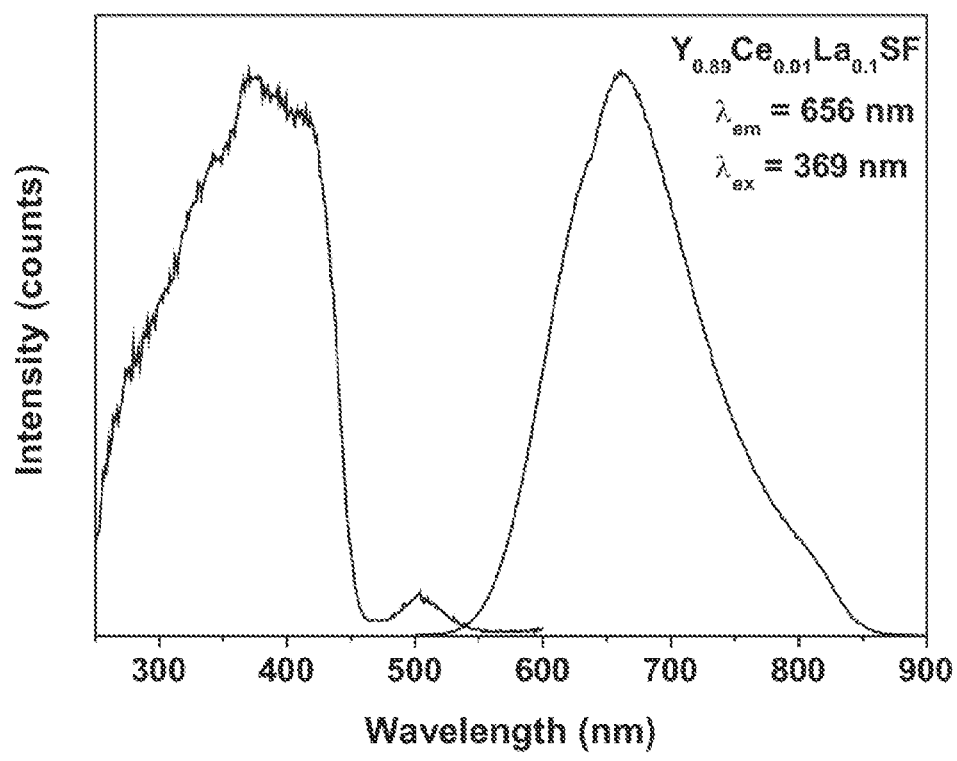
FIGS. 9-13 are the excitation and emission spectra of Examples 12, 15, and 18-20 respectively
Figure 10:
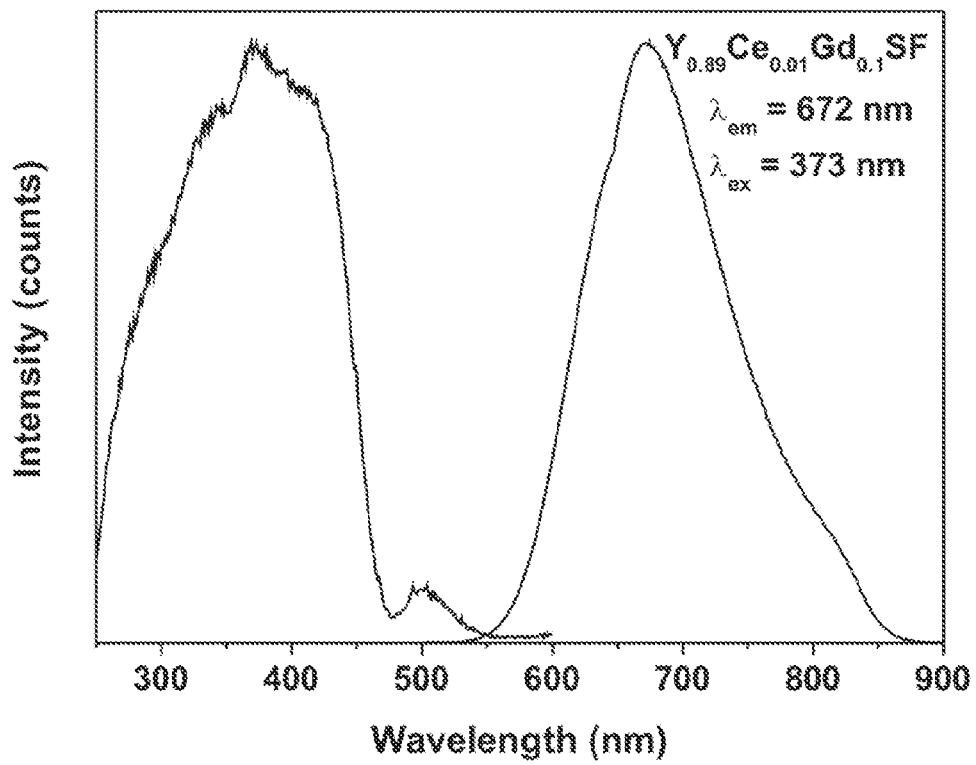
Figure 11:
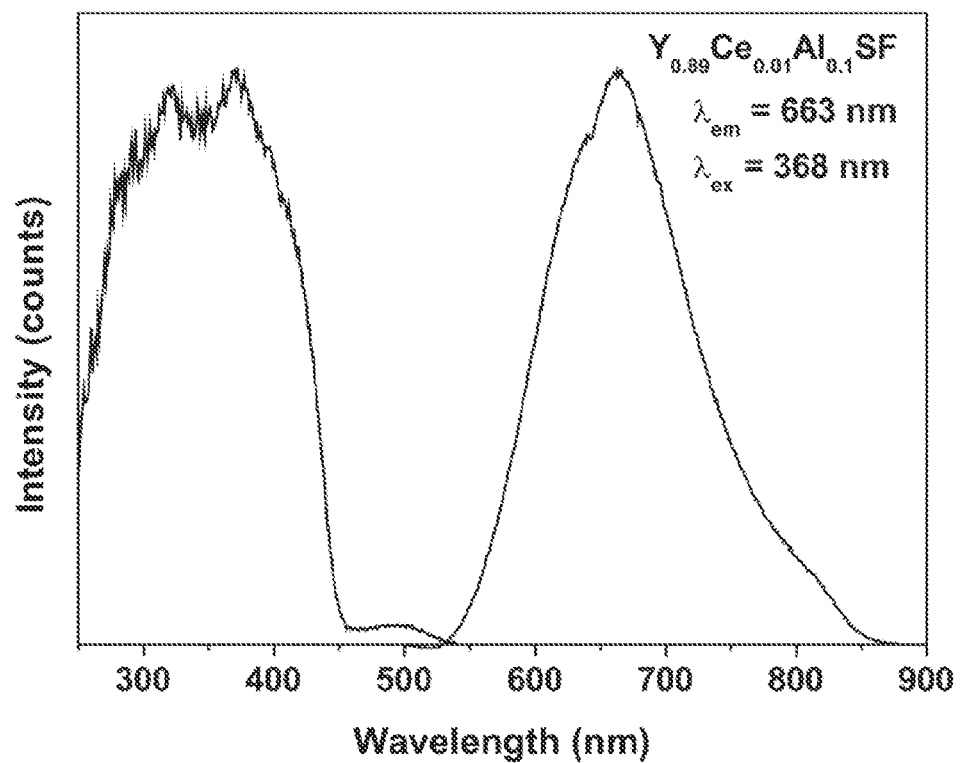
Figure 12:
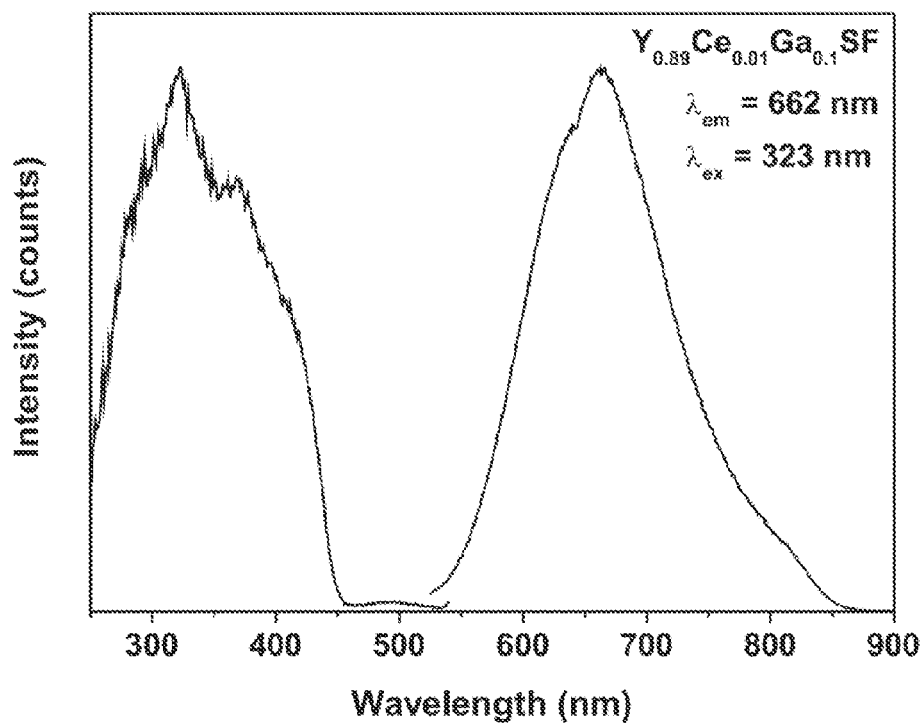
Figure 13:
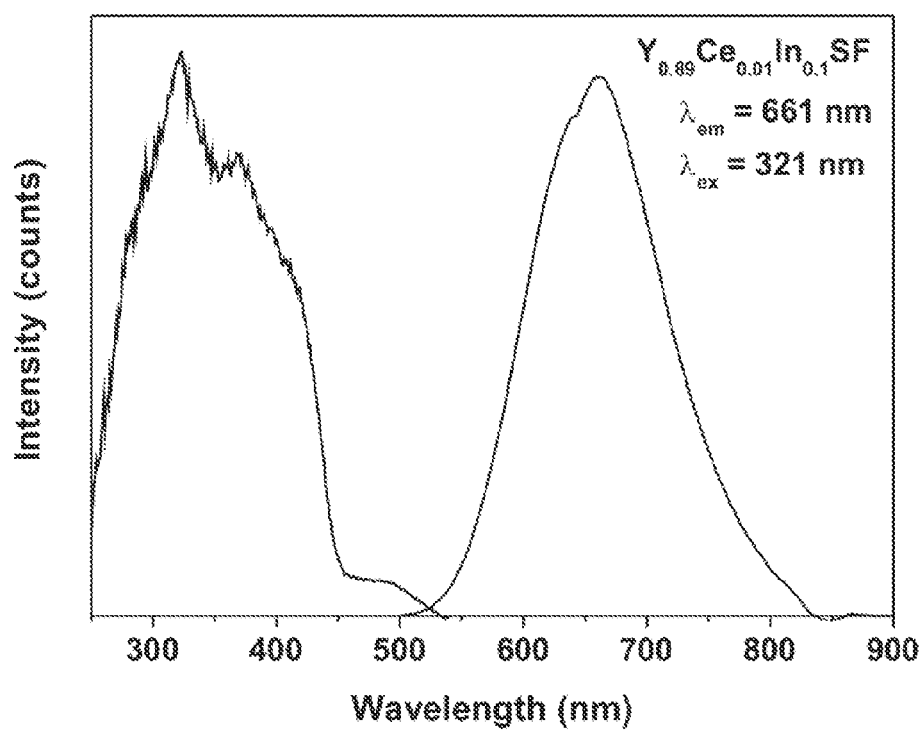

The XRD spectra of Example 15 are presented in FIG. 8, where Example 15 shows the same latttic structure as the Examples 1-8 in embodiment 1. The excitation and emission spectra of Examples 12, 15, and 18-20 are illustrated in FIGS. 9-13, respectively. The photoluminescence properties of Example 11-20 are summarized in Table 3.

TABLE 3

Photoluminescence properties of $\alpha\text{-}(Y_{0.89}Ce_{0.01}B_{0.1})SF$

| Example | | Main Ex Range (nm) | Excitation (nm) | Main Em Range (nm) | Emission (nm) | CIE (x, y) |
|---|---|---|---|---|---|---|
| 11 | $\alpha\text{-}(Y_{0.89}Ce_{0.01}Sc_{0.1})SF$ | 250-545 | 365 | 526-848 | 659 | 0.64, 0.34 |
| 12 | $\alpha\text{-}(Y_{0.89}Ce_{0.01}La_{0.1})SF$ | 250-546 | 369 | 523-848 | 656 | 0.64, 0.35 |
| 13 | $\alpha\text{-}(Y_{0.89}Ce_{0.01}Sm_{0.1})SF$ | 250-550 | 368 | 530-850 | 657 | 0.64, 0.36 |
| 14 | $\alpha\text{-}(Y_{0.89}Ce_{0.01}Eu_{0.1})SF$ | 250-551 | 369 | 532-850 | 656 | 0.64, 0.36 |
| 15 | $\alpha\text{-}(Y_{0.89}Ce_{0.01}Gd_{0.1})SF$ | 250-573 | 373 | 527-875 | 672 | 0.67, 0.32 |
| 16 | $\alpha\text{-}(Y_{0.89}Ce_{0.01}Tb_{0.1})SF$ | 250-562 | 370 | 530-869 | 666 | 0.66, 0.31 |
| 17 | $\alpha\text{-}(Y_{0.89}Ce_{0.01}Dy_{0.1})SF$ | 250-571 | 371 | 528-851 | 667 | 0.67, 0.31 |
| 18 | $\alpha\text{-}(Y_{0.89}Ce_{0.01}Al_{0.1})SF$ | 250-540 | 368 | 518-830 | 663 | 0.61, 0.40 |
| 19 | $\alpha\text{-}(Y_{0.89}Ce_{0.01}Ga_{0.1})SF$ | 250-542 | 323 | 520-843 | 662 | 0.62, 0.39 |
| 20 | $\alpha\text{-}(Y_{0.89}Ce_{0.01}In_{0.1})SF$ | 250-533 | 321 | 522-845 | 661 | 0.62, 0.40 |

The influence of different metal of $B^{3+}$ in $\alpha\text{-}(Y_{0.89}Ce_{0.01}B_{0.1})SF$ on the photoluminescence properties are observed minor from the results in Table 3 and FIGS. 9-13. The excitation range of $\alpha\text{-}(Y_{0.89}Ce_{0.01}B_{0.1})SF$ is in range 250-571 nm, and emission of $\alpha\text{-}(Y_{0.89}Ce_{0.01}B_{0.1})SF$ is in range 518-869 nm. The data above shows that these red phosphors have wider excitation and emission spectrum, and better color saturation, for the emitted red light to solve the poor color rendering problem of the conventional red phosphors.

Embodiment 4: β-YSF Dope with Different Concentration of $Ce^{3+}$

First of all, different concentrations of $Ce^{3+}$ were doped in β-YSF performed in order to examine the effectiveness of $Ce^{3+}$ concentration on photoluminescence properties of the phosphors. In this embodiment, $A^{3+}$ is $Y^{3+}$, y is 0, x is 0, 0.001, 0.005, 010, 0.020, 0.030, 0.050, 0.075, 0.100 and 1 respectively in the formula $\beta\text{-}(A_{1-x-y}Ce_xB_y)SF$. The preparing method is as described in FIG. 1, where calcination temperature is 1150 to 1200° C. in order to obtain the green color phosphors.

Figure 14:
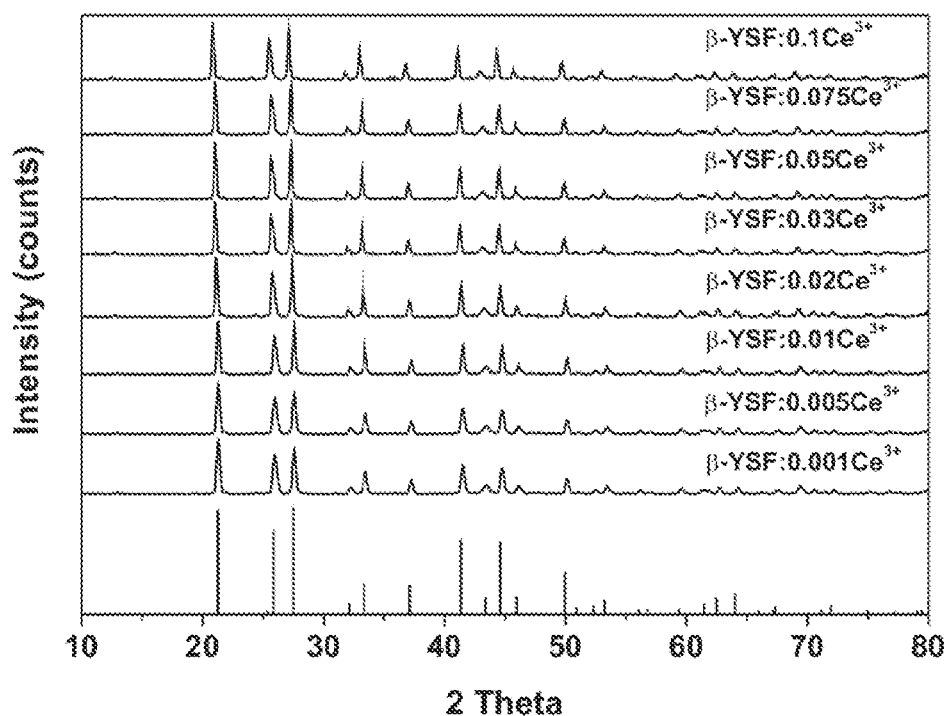
FIG. 14 is the XRD spectra of β-YSF:xCe$^{3+}$.
Figure 15:
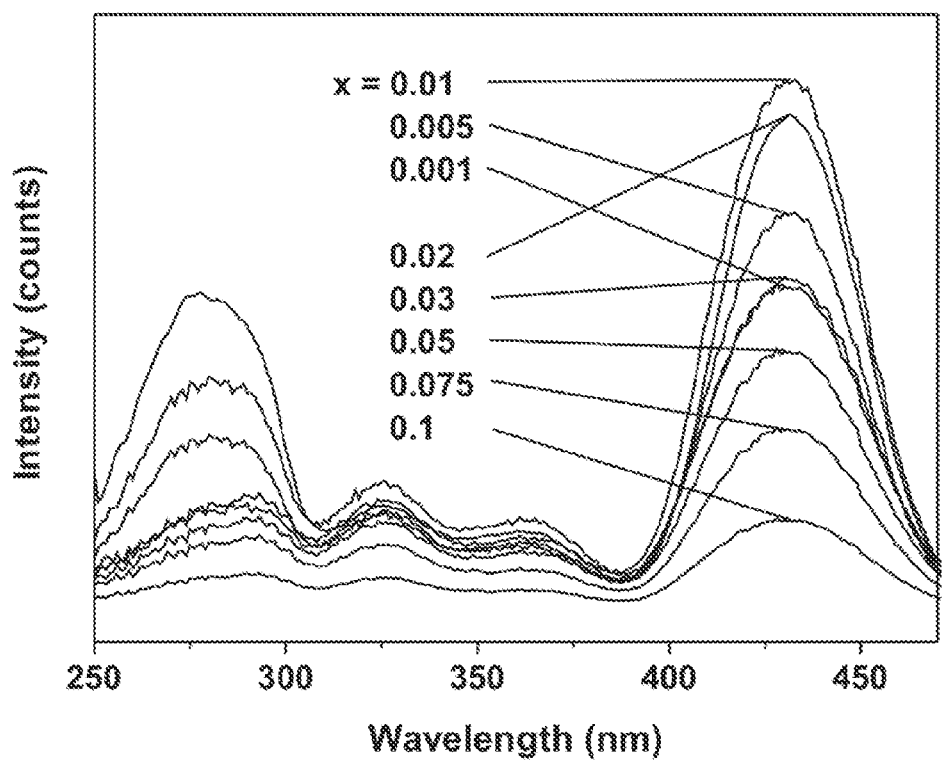
FIGS. 15-16 are excitation spectra and emission spectra of β-$(Y_{0.99})$S:xCe$^{3+}$ respectively.
Figure 16:
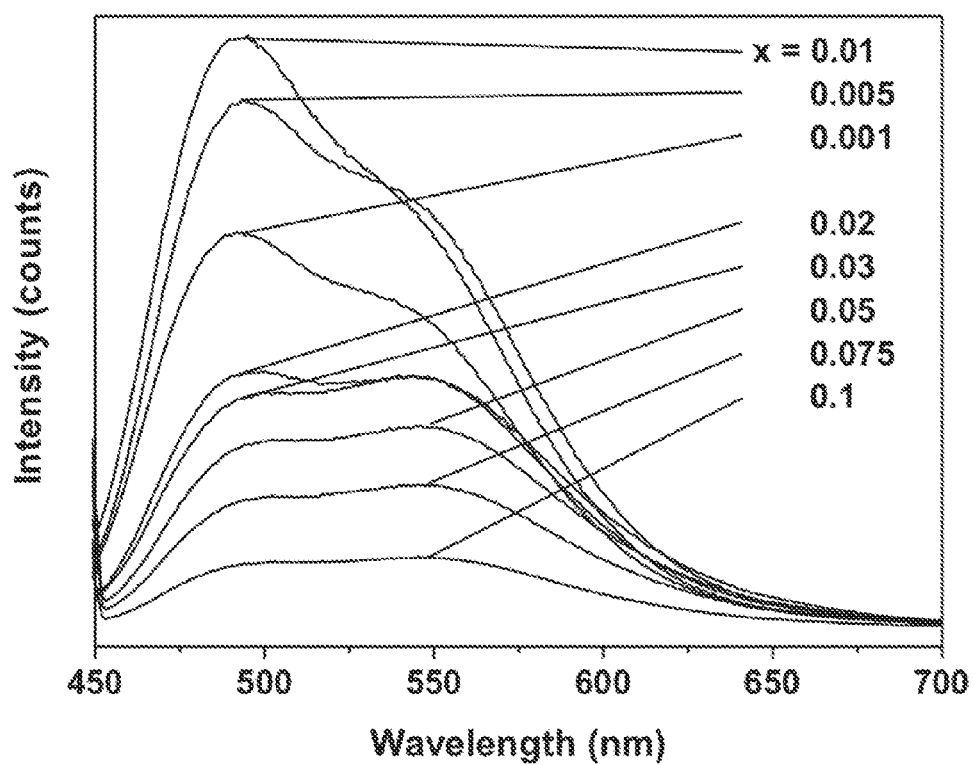

The XRD spectra, the excitation spectrum and the emission spectrum of Examples 21-28 are shown in FIG. 14-16 respectively, where the formula β-YSF:xCe$^{3+}$ in FIG. 2 equals to the chemical formula $\beta\text{-}(A_{1-x}Ce_x)SF$. The photoluminescence properties of Examples 21-29 are summarized in Table 4.

The results indicate that the lattice structure of β-YSF remain the same with doped $Ce^{3+}$ concentration increasing to 10 mol % in FIG. 14.

The influence of doped $Ce^{3+}$ concentration in the green phosphor on the photoluminescence properties are minor observed from Table 1, FIG. 4 and FIG. 5, but the emission wavelengths are shifted from green to yellow-green color region gradually (from Example 21 to Example 29) resulting from the position site of the lattice. Two different position sites, 6-coordinate site and 8-coordinate site, for $Ce^{3+}$ in the fluorosulfide lattice based on crystal structure analysis has been reported (Rysanek, N., Loye, O. (1973) *Structure crystalline de YSF(β)*, Acta. Cryst., B29, 1567). The position site of $Ce^{3+}$ are gradually transferred from 8-coordinate site to 6-coordinate site with increasing concentration of $Ce^{3+}$, which result in the emission wavelength shift from 492 nm to 550 nm in yellow-green color region.

Besides, the major excitation wavelength between 250 to 470 nm and major excitation wavelength between 441 to 700 nm are observed in these exemplary embodiments of the green phosphors according to FIGS. 15-16. Furthermore, the maximum excitation value (at 430 nm in blue light region) and the maximum emission intensity (at 492 nm in green light region) are observed when doped $Ce^{3+}$ concentration is 1 mol % in β-YSF, i.e. x=0.01 (Example 23) according to the exci-

TABLE 4

Photoluminescence properties of $Ce^{3+}$-doped β-YSF in different concentration

| Example | | Main Ex Range (nm) | Excitation (nm) | Main Em Range (nm) | Emission (nm) | CIE (x, y) |
|---|---|---|---|---|---|---|
| 21 | $\beta\text{-}(Y_{0.999}Ce_{0.001})SF$ | 250-470 | 430 | 445-700 | 492 | 0.24, 0.47 |
| 22 | $\beta\text{-}(Y_{0.995}Ce_{0.005})SF$ | 250-470 | 430 | 441-700 | 494 | 0.26, 0.48 |
| 23 | $\beta\text{-}(Y_{0.99}Ce_{0.01})SF$ | 250-470 | 430 | 439-700 | 495 | 0.26, 0.49 |
| 24 | $\beta\text{-}(Y_{0.98}Ce_{0.02})SF$ | 250-470 | 430 | 440-700 | 497 | 0.30, 0.50 |
| 25 | $\beta\text{-}(Y_{0.97}Ce_{0.03})SF$ | 250-470 | 430 | 441-700 | 543 | 0.32, 0.50 |
| 26 | $\beta\text{-}(Y_{0.95}Ce_{0.05})SF$ | 250-470 | 430 | 443-700 | 549 | 0.33, 0.51 |
| 27 | $\beta\text{-}(Y_{0.925}Ce_{0.075})SF$ | 250-470 | 430 | 444-700 | 549 | 0.34 0.50 |
| 28 | $\beta\text{-}(Y_{0.9}Ce_{0.1})SF$ | 250-470 | 430 | 446-700 | 550 | 0.35, 0.50 |
| 29 | β-CeSF | 250-562 | 450 | x | x | x |

Embodiment 3: $\alpha$-$(Y_{0.89}Ce_{0.01}B_{0.1})$SF Dope with Different Metal of $B^{3+}$ Different metal of $B^{3+}$ were doped in $\alpha$-$(Y_{0.89}Ce_{0.01}B_{0.1})$SF in order to investigate the effectiveness of $B^{3+}$ on photoluminescence properties of the red phosphors. In this embodiment, x=0.01, y=0.1, and $A^{3+}$ is $Y^{3+}$, $B^{3+}$ is $Sc^{3+}$, $La^{3+}$, $Sm^{3+}$, $Eu^{3+}$, $Gd^{3+}$, $Tb^{3+}$, $Dy^{3+}$, $Al^{3+}$, $Ga^{3+}$, and $In^{3+}$, respectively. The preparing method is described in FIG. 1, where the calcination temperature is 900 to 950° C. in order to obtain the red color phosphors.

Figure 17:
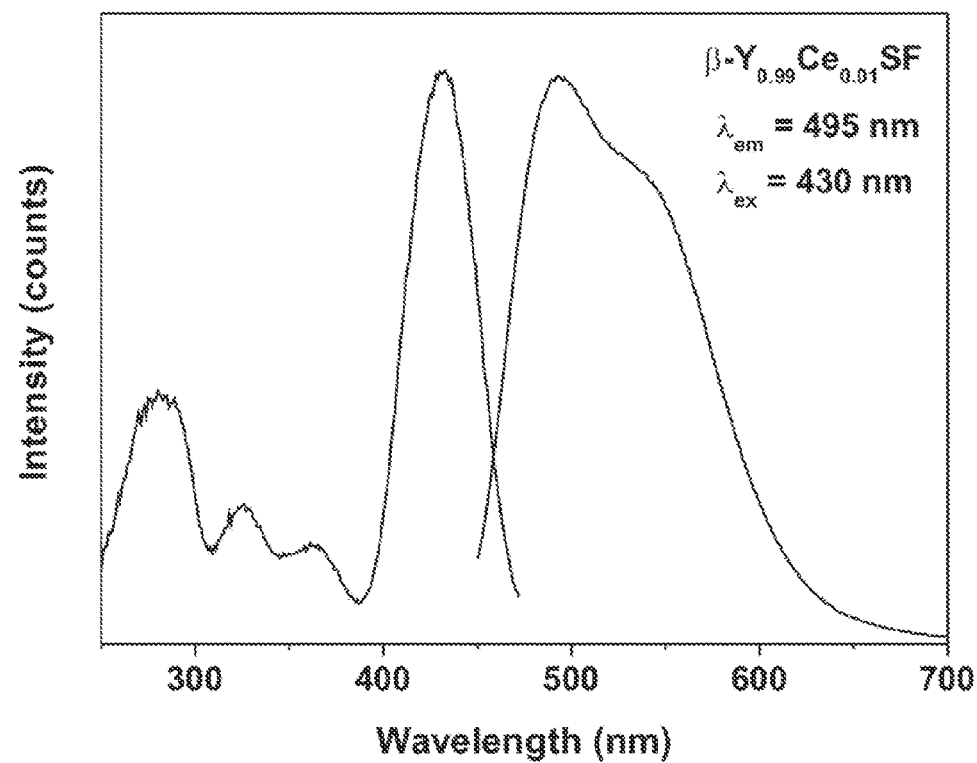
FIG. 17 is excitation and emission spectra of β-$Y_{0.99}Ce_{0.01}SF$ from Example 23.

The XRD spectra of Example 15 are presented in FIG. 8, where Example 15 shows the same latttic structure as the Examples 1-8 in embodiment 1. The excitation and emission spectra of Examples 12, 15, and 18-20 are illustrated in FIGS. 9-13, respectively. The photoluminescence properties of Example 11-20 are summarized in Table 3. tation and emission spectra shown in FIG. 17. No emitted light is observable when y=1 (Example 29, $\alpha$-CeSF) according to Table 4.

Hence, comparing to the conventional green phosphors, the exemplary embodiments of the present invention have a great improvement with respect to the wide excitation and emission ranges and saturated green color and color rendering.

Embodiment 5: $\beta$-$(A_{0.9}Ce_{0.1})$SF Doped with Different Metal of $A^{3+}$ Different metal of $A^{3+}$ were doped in $\beta$-$(A_{0.9}Ce_{0.1})$SF in order to investigate the effectiveness of $A^{3+}$ on photoluminescence properties of the phosphors. In this embodiment, y is 0, x is 0.1, $A^{3+}$ is $Y^{3+}$ or $La^{3+}$ in the formula $\beta$-$(A_{1-x-y}Ce_xB_y)$SF. The preparing method is described in FIG. 1, where calcinations temperature is 1150 to 1200° C. in order to obtain the green color phosphors.

The photoluminescence properties of Examples 23 and 30 are presented in Table 2. The emission spectra of two exemplary embodiments are in green color region, but two main emission peak values are different.

TABLE 5 photoluminescence properties of $\beta$-$(A_{0.9}Ce_{0.1})$SF

| Example | Main Ex Range (nm) | Excitation (nm) | Main Em Range (nm) | Emission (nm) | CIE (x, y) |
|---|---|---|---|---|---|
| 23 $\beta$-$(Y_{0.99}Ce_{0.01})$SF | 250-470 | 430 | 439-700 | 495 | 0.26, 0.49 |
| 30 $\beta$-$(La_{0.99}Ce_{0.01})$SF | 250-485 | 435 | 472-700 | 540 | 0.37, 0.52 |

Embodiment 6: $\beta$-$(Y_{0.89}Ce_{0.01}B_{0.1})$SF Doped with Different Metal of $B^{3+}$ Different metal of $B^{3+}$ were doped in $\beta$-$(Y_{0.89}Ce_{0.01}B_{0.1})$SF in order to investigate the effectiveness of $B^{3+}$ on excitation and emission properties of the phosphors. In this embodiment, x=0.01, y=0.1, and $A^{3+}$ is $Y^{3+}$, $B^{3+}$ is $Sc^{3+}$, $La^{3+}$, $Sm^{3+}$, $Eu^{3+}$, $Gd^{3+}$, $Tb^{3+}$, $Dy^{3+}$, $Al^{3+}$, $Ga^{3+}$, and $In^{3+}$, respectively. The preparing method is as described in FIG. 1, where calcination temperature is 1150 to 1200° C. in order to obtain the green color phosphors.

Figure 18:
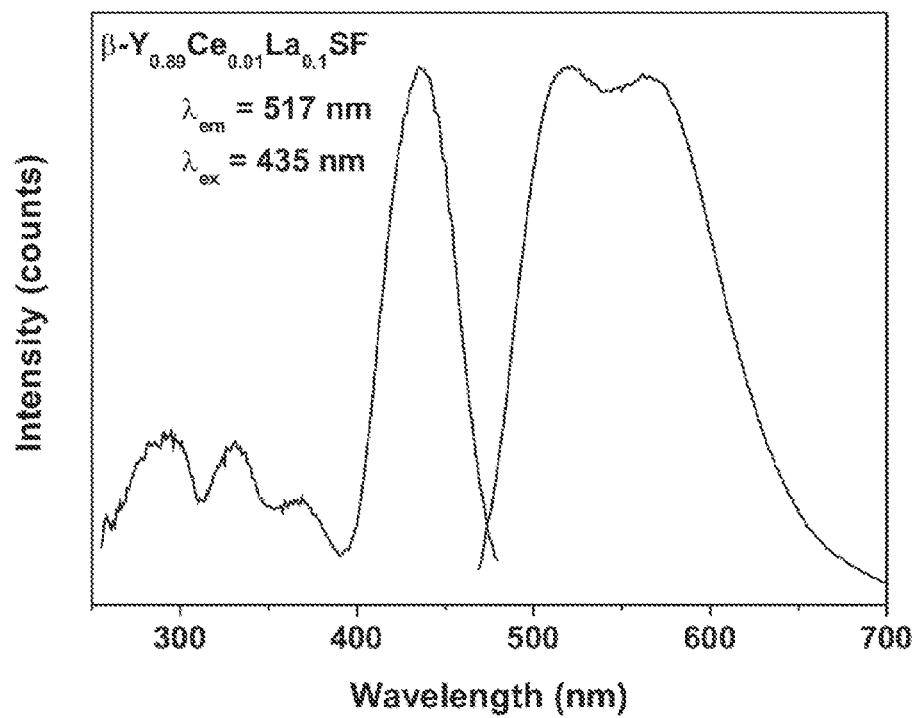
FIGS. 18-20 are excitation and emission spectra of Examples 32, 35 and 40 respectively.
Figure 19:
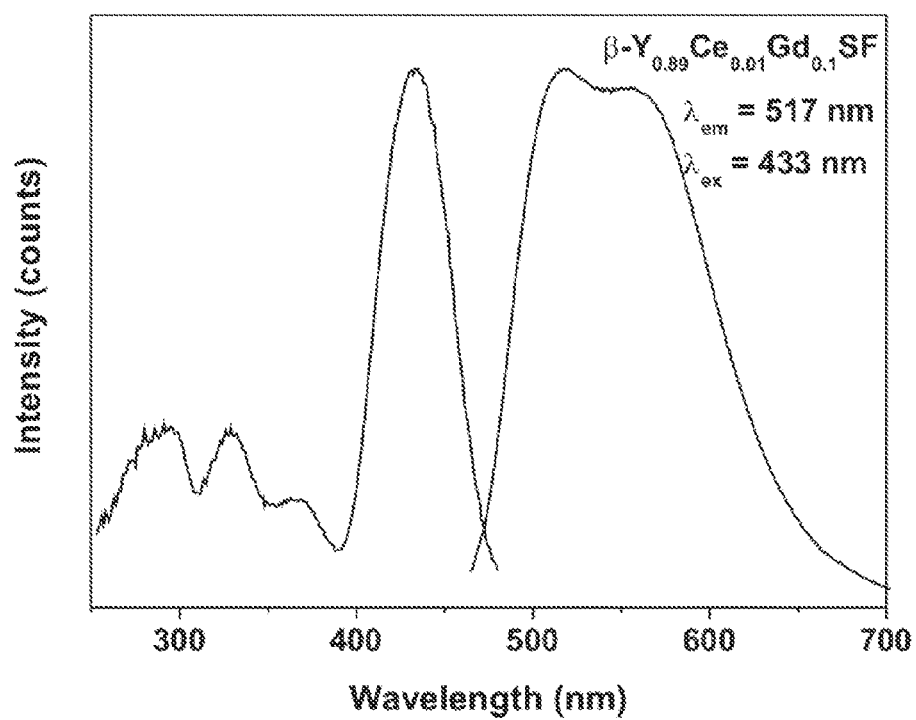
Figure 20:
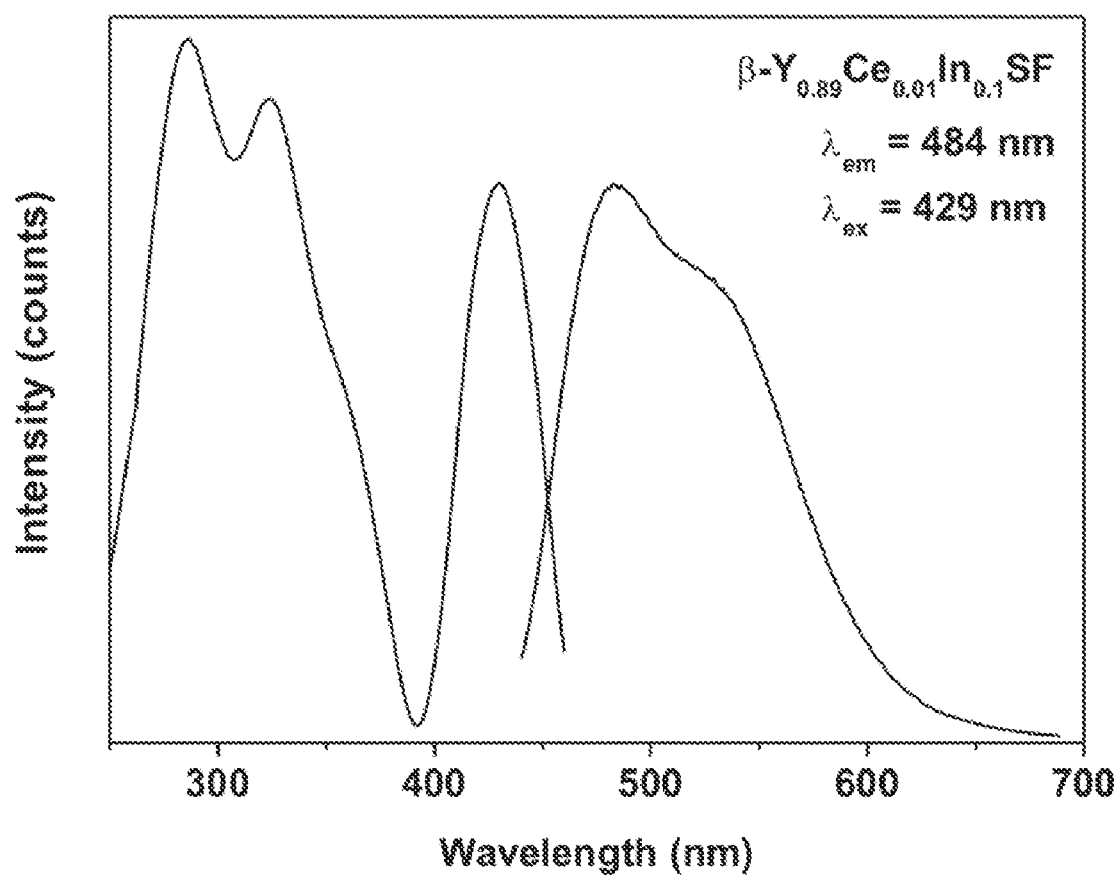

The excitation and emission spectra of Examples 32, 35, and 40 are respectively illustrated in FIGS. 18-20. The photoluminescence properties of Examples 31-40 are summarized in Table 6.

TABLE 6 photoluminescence properties of $\beta$-$(Y_{0.89}Ce_{0.01}B_{0.1})$SF

| Example | Main Ex Range (nm) | Excitation (nm) | Main Em Range (nm) | Emission (nm) | CIE (x, y) |
|---|---|---|---|---|---|
| 31 $\beta$-$(Y_{0.89}Ce_{0.01}Sc_{0.1})$SF | 250-468 | 429 | 449-700 | 493 | 0.23, 0.42 |
| 32 $\beta$-$(Y_{0.89}Ce_{0.01}La_{0.1})$SF | 250-480 | 435 | 468-700 | 521 | 0.38, 0.55 |
| 33 $\beta$-$(Y_{0.8}9Ce_{0.01}Sm_{0.1})$SF | 250-479 | 433 | 465-700 | 518 | 0.37, 0.55 |
| 34 $\beta$-$(Y_{0.89}Ce_{0.01}Eu_{0.1})$SF | 250-480 | 433 | 465-700 | 518 | 0.37, 0.55 |
| 35 $\beta$-$(Y_{0.89}Ce_{0.01}Gd_{0.1})$SF | 250-479 | 433 | 465-700 | 517 | 0.37, 0.55 |
| 36 $\beta$-$(Y_{0.89}Ce_{0.01}Tb_{0.1})$SF | 250-481 | 433 | 467-700 | 518 | 0.38, 0.54 |

TABLE 6-continued photoluminescence properties of $\beta$-$(Y_{0.89}Ce_{0.01}B_{0.1})SF$

| Example | Main Ex Range (nm) | Excitation (nm) | Main Em Range (nm) | Emission (nm) | CIE (x, y) |
|---|---|---|---|---|---|
| 37 $\beta$-$(Y0._{89}Ce_{0.01}Dy_{0.1})SF$ | 250-481 | 433 | 466-700 | 518 | 0.38, 0.54 |
| 38 $\beta$-$(Y_{0.89}Ce_{0.01}Al_{0.1})SF$ | 250-458 | 418 | 426-700 | 478 | 0.20, 0.39 |
| 39 $\beta$-$(Y_{0.89}Ce_{0.01}Ga_{0.1})SF$ | 250-460 | 421 | 430-700 | 478 | 0.21, 0.40 |
| 40 $\beta$-$(Y_{0.89}Ce_{0.01}In_{0.1})SF$ | 250-465 | 429 | 435-700 | 484 | 0.23, 0.42 |

Different $B^{3+}$ metals doped in $\beta$-$(Y_{0.89}Ce_{0.01}B_{0.1})SF$ has some influence on the photoluminescence properties observed from the results in Table 6 and FIGS. 18-20. The main emission wavelength is between 493-518 nm when $B^{3+}$ is a rare earth metal (Examples 31-37) in $\beta$-$(Y_{0.89}Ce_{0.01}B_{0.1})$SF, whereas the main emission wavelength are between 478-484 nm when $B^{3+}$ is a group 13 metal (Examples 38-40). It is assumed that the main emission wavelength depends on the doped metal type in $\beta$-$(Y_{0.89}Ce_{0.01}B_{0.1})$SF. Besides, the green phosphors presented herein have the broader excitation and emission range and better green color saturation shown in FIGS. 18-20.

According to the disclosure above, the novel red and green phosphors based on $Ce^{3+}$-doped fluorosulfide can serve as a potential candidate for white-light LED. The red phosphors and the green phosphors presented herein exhibit the better luminescent properties with respect to light conversion efficiency, broad-band emitting characteristic and red/green color saturation in UV or blue light excitation region. Furthermore, both phosphors described above are easily to prepare, i.e. no necessity of high pressure or high temperature condition when calcination), and thus reduce the production costs. Hence, the phosphors presented herein solve the issues, such as color saturation and preparation cost issues of the conventional red and green phosphors.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, each feature disclosed is one example only of a generic series of equivalent or similar features.

What is claimed is:

1. A fluorosulfide phosphor having a chemical formula of $(A_{1-x-y}Ce_xB_y)SF$, wherein A and B are trivalent metal ions other than Ce, $0<x \leq 0.1$ and $0 \leq y \leq 1$.

2. The fluorosulfide phosphor of claim 1, wherein the fluorosulfide phosphor is a red phosphor when the crystal structure of the fluorosulfide phosphor is tetragonal crystal system.

3. The fluorosulfide phosphor of claim 1, wherein the fluorosulfide phosphor is a green phosphor when the crystal structure of the fluorosulfide phosphor is hexagonal crystal system.

4. The fluorosulfide phosphor of claim 1, wherein A is a rare earth metal.

5. The fluorosulfide phosphor of claim 1, wherein B is a rare earth metal or a group 13 metal.

6. The fluorosulfide phosphor of claim 1, wherein the chemical formula is $(A_{1-xCex})SF$ when y is zero.

7. A white light emitting diode, comprising:
   a blue phosphor;
   a green phosphor; and
   a red phosphor, where chemical formula of the red phosphor is $(A_{1-x-y}Ce_xB_y)SF$, A and B are trivalent metal ions other than Ce, $0<x \leq 0.1$ and $0 \leq y \leq 1$, and crystal structure of the red phosphor is tetragonal crystal system.

8. The white light emitting diode of claim 7, wherein the green phosphor has the chemical formula of $(A_{1-x-y}Ce_xB_y)SF$, A and B are trivalent metal ions other than Ce, $0<x \leq 0.1$ and $0 \leq y \leq 1$, and crystal structure of the green phosphor is hexagonal crystal system.

9. A white light emitting diode, comprising:
   a blue phosphor;
   a red phosphor; and
   a green phosphor, where chemical formula of the green phosphor is $(A_{1-x-y}Ce_xB_y)SF$, A and B are trivalent metal ions other than Ce, $0<x \leq 0.1$ and $0 \leq y \leq 1$, and crystal structure of the green phosphor is hexagonal crystal system.

10. The white light emitting diode of claim 9, wherein the red phosphor has the chemical formula of $(A_{1-x-y}Ce_xB_y)SF$, A and B are trivalent metal ions other than Ce, $0<x \leq 0.1$ and $0 \leq y \leq 1$, and crystal structure of the red phosphor is tetragonal crystal system.

* * * * *